US011331614B2

(12) United States Patent
Ge et al.

(10) Patent No.: US 11,331,614 B2
(45) Date of Patent: May 17, 2022

(54) THERMALLY CONDUCTIVE PARTICULATE SENSOR

(71) Applicant: HEWLETT-PACKARD DEVELOPMENT COMPANY, L.P., Spring, TX (US)

(72) Inventors: Ning Ge, Palo Alto, CA (US); Paul Howard Mazurkiewicz, Fort Collins, CO (US); Helen A. Holder, Palo Alto, CA (US); Peter A. Seiler, Fort Collins, CO (US); Raphael Gay, Fort Collins, CO (US); Tom J. Searby, Fort Collins, CO (US)

(73) Assignee: Hewlett-Packard Development Company, L.P., Spring, TX (US)

( * ) Notice: Subject to any disclaimer, the term of this patent is extended or adjusted under 35 U.S.C. 154(b) by 338 days.

(21) Appl. No.: 16/484,163

(22) PCT Filed: Feb. 8, 2017

(86) PCT No.: PCT/US2017/016963
§ 371 (c)(1),
(2) Date: Aug. 7, 2019

(87) PCT Pub. No.: WO2018/147839
PCT Pub. Date: Aug. 16, 2018

(65) Prior Publication Data
US 2020/0023301 A1 Jan. 23, 2020

(51) Int. Cl.
*B01D 46/00* (2022.01)
*F24F 11/39* (2018.01)
*B01D 46/44* (2006.01)
*B01D 46/46* (2006.01)
(Continued)

(52) U.S. Cl.
CPC ....... *B01D 46/448* (2013.01); *B01D 46/0086* (2013.01); *B01D 46/442* (2013.01);
(Continued)

(58) Field of Classification Search
CPC .............. B01D 46/0086; B01D 46/442; B01D 46/448; B01D 46/46; B01D 2279/45;
(Continued)

(56) References Cited

U.S. PATENT DOCUMENTS 6,507,282 B1 * 1/2003 Sherwood .......... B01D 46/0086
340/607
8,506,674 B1 8/2013 Brown-Fitzpatrick et al.
(Continued)

FOREIGN PATENT DOCUMENTS

CN 201083702 7/2008
CN 201083702 Y * 7/2008 ............. G01N 25/18
(Continued)

OTHER PUBLICATIONS

CN201083702Y_ENG (Espacenet machine translation of Xu) (Year: 2008).*
(Continued)

*Primary Examiner* — Jonathan Miller
*Assistant Examiner* — Gabriel E Gitman
(74) *Attorney, Agent, or Firm* — Brooks Cameron & Huebsch PLLC (57) ABSTRACT

In an example, an air filter system includes an air filter and a thermally conductive particulate sensor (TCPS). The TCPS includes a temperature sensor to measure a first temperature of the TCPS at a first time, measure a second temperature of the TCPS at a second time, and provide the measured first temperature and the measured second temperature to a controller. The controller to determine an actual rate of temperature change based on the measured first temperature and the measured second temperature, compare the actual rate of temperature change to a target rate of temperature change, and provide a notification when a difference between the actual rate of temperature change and
(Continued)

the target rate of temperature change is greater than an accumulation threshold indicative of a threshold amount of particulate accumulation on the TCPS.

15 Claims, 5 Drawing Sheets

(51) Int. Cl.
    *G01N 15/06*     (2006.01)
    *G01N 15/00*     (2006.01)
    *H05K 7/20*     (2006.01)

(52) U.S. Cl.
    CPC ......... *B01D 46/46* (2013.01); *G01N 15/0618* (2013.01); *B01D 2279/45* (2013.01); *G01N 2015/0046* (2013.01); *H05K 7/20009* (2013.01)

(58) Field of Classification Search
    CPC ............. B01D 35/143; G01N 15/0618; G01N 2015/0046; H05K 7/20009; G01K 3/10; G01K 13/02; F24F 11/30; F24F 11/39; F24F 11/64; F24F 3/16; Y10S 116/25; F02M 35/09
    See application file for complete search history.

(56) References Cited

U.S. PATENT DOCUMENTS

| | | | |
|---|---|---|---|
| 8,784,540 B2 | 7/2014 | Rubit et al. | |
| 2005/0247194 A1* | 11/2005 | Kang | ................... B01D 46/444 95/19 |
| 2007/0144354 A1* | 6/2007 | Muller | ............... B01D 46/4254 96/417 |
| 2012/0125558 A1* | 5/2012 | Nortman | ................... G01F 1/68 165/11.1 |
| 2012/0260727 A1* | 10/2012 | Kinkade, Jr. | ...... B01D 46/4263 73/204.27 |

FOREIGN PATENT DOCUMENTS

| | | | | |
|---|---|---|---|---|
| CN | 103608718 | | 2/2014 | |
| JP | 2000074451 | | 3/2000 | |
| JP | 2012066190 | | 2/2014 | |
| KR | 20040028872 A | * | 4/2004 | ............. B01D 46/44 |
| KR | 101020171 | | 3/2011 | |
| KR | 101110347 | | 2/2012 | |
| KR | 101289647 | | 7/2013 | |

OTHER PUBLICATIONS

Littelfuse. (2002). Thermistor Manufacturing Process. Accessed Sep. 1, 2021 at https://www.littelfuse.com/technical-resources/technical-centers/temperature-sensors/thermistor-info/thermistor-manufacturing.aspx (Year: 2002).*

KR20040028872A_ENG (Espacenet machine translation of Lee) (Year: 2004).*

OMRON Clogged Air Filter Sensor D6a, Retrieved from the Internet on Nov. 28, 2016: https://echannel.omron247.com/marcom/pdfcatal.nsf/PDFLookupByUniqueID/DE299E983F7351FE86256BCD00595D70/$File/D22D6A0602.pdf?OpenElement.

* cited by examiner

THERMALLY CONDUCTIVE PARTICULATE SENSOR

BACKGROUND

Filters can be used in various types of electronic devices to remove or reduce particulates from fluid entering the electronic devices. For example, an electronic device can use a flow of air to perform convective heat transference. A filter can be placed in the path of an airflow to remove particulates from entering an inner chamber of the electronic device. In other examples, a filter can be used to remove particulates from a flow of liquid, such as water or other liquids.

DETAILED DESCRIPTION

A filter can be used in an electronic device to remove particulates from a flow of fluid. A fluid can refer to a gas (such as air or another type of gas) and/or a liquid (such as water or another type of liquid). Examples of electronic devices that can include filters to remove particulates from fluid include a server, a desktop, a laptop, a tablet, a mobile phone, a heating, ventilating, and air conditioning (HVAC) device, manufacturing or other industrial equipment, flow control equipment, an engine of a vehicle, a fluid filtration system, among other types of electronic devices. Examples of particulates include dust particles in air, debris in liquid, powder used in industrial equipment, shavings from milling or grinding equipment, biological materials (such as hair, skin cells, pollen, and other biological matter shed by plants and animals), and so forth.

A filter used in an electronic device may become clogged with particulates over time. For instance, as particulates on the filter increases over an operational lifetime of the filter, the filter may become less effective and/or the electronic device may not receive sufficient fluid flow from the filter to function as intended. For example, reduced fluid flow rate caused by a clogged filter may reduce a heat exchange or gas exchange capability of an electronic device.

Moreover, accumulation of particulates on a filter in an electronic device can pose risks to an environment around the electronic device, to humans who are using or in the proximity of the electronic device, and/or to the electronic device itself. Examples of risks to an electronic device caused by particulates include mechanical erosion or failure, chemical corrosion, electrical shorting, failure or damage caused by over-heating, or other risks. Examples of risks to humans in the proximity of the electronic device include electric shock from catastrophic failure of a voltage electronic device due to over temperature events, exposure of humans to undesirable levels of particulates, and so forth.

For at least the above reasons, it may be desirable to determine when a filter is nearing the end of its useful operational life such as when the filter has become clogged or is nearing being clogged.

As such, some approaches may measure changes in electrical signals associated with a filter that may correspond to increases in particulates on the filter. For instance, some approaches may measure an impedance, inductance, capacitance, and/or resistance between 'spaced' electrodes included in or near a filter having air spaces between the 'spaced' electrodes. However, 'spaced' electrodes may be subject to 'hot spots' when particulates having a diameter equal to or greater than a diameter of the 'space' between the electrodes accumulate between the electrodes. Such particulates can 'short' out the electrodes and give an erroneously large reading/representation of an amount of particulates on the filter. Thus, the 'spaced' electrodes may not provide an accurate measurement or representation of an amount of particulates retained by the filter.

Accordingly, the disclosure is directed to a thermally conductive particulate sensor (TCPS)s. A TCPS can be included in an air filter system. As used herein, an air filter system refers to an air filter coupled to a TCPS. For example, an air filter system can include an air filter and a TCPS. The TCPS includes a temperature sensor to measure a first temperature of the TCPS at a first time, measure a second temperature of the TCPS at a second time, and provide the measured first temperature and the measured second temperature to a controller. The controller is to determine an actual rate of temperature change based on the measured first temperature and the measured second temperature, compare the actual rate of temperature change to a target rate of temperature change; and provide a notification (e.g., to clean or replace the air filter) when a difference between the actual rate of temperature change and the target rate of temperature change is greater than an accumulation threshold indicative of a threshold amount of particulate accumulation on the TCPS.

Notably, the air filter system including a TCPS does not include 'spaced' electrodes. As such, the TCPS is not subject to 'hot spots' associated with the use of 'spaced' electrodes and may have a smaller form factor than approaches employing 'spaced' electrodes.

Figure 1:
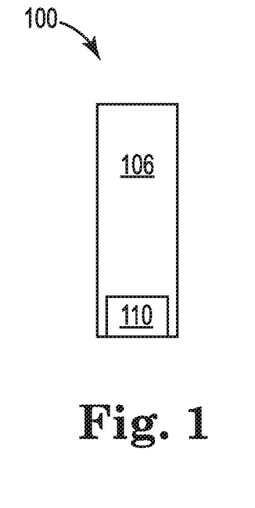
FIG. 1 illustrates an example of an air filter system including a thermally conductive particulate sensor (TCPS)s in accordance with the disclosure.

FIG. 1 illustrates an example of an air filter system 100 including a TCPS 110 in accordance with the disclosure. As illustrated in FIG. 1, the air filter system 100 includes an air filter 106 and the TCPS 110.

The air filter system 100 can be removably coupled to an electronic device. That is, the air filter system 100, when coupled to an electronic device, is removable from an electronic device. Removal of the air filter system 100 from an electronic device can include removal of the air filter 106 and/or the TCPS 110 from the electronic device (e.g., a laptop). For instance, in various examples, the air filter 106 and the TCPS 110 are integral or otherwise coupled together so removal of the air filter system 100 from the electronic device results in removal of each the air filter 106 and the TCPS 110 from the electronic device. However, the disclosure is not so limited.

Figure 4:
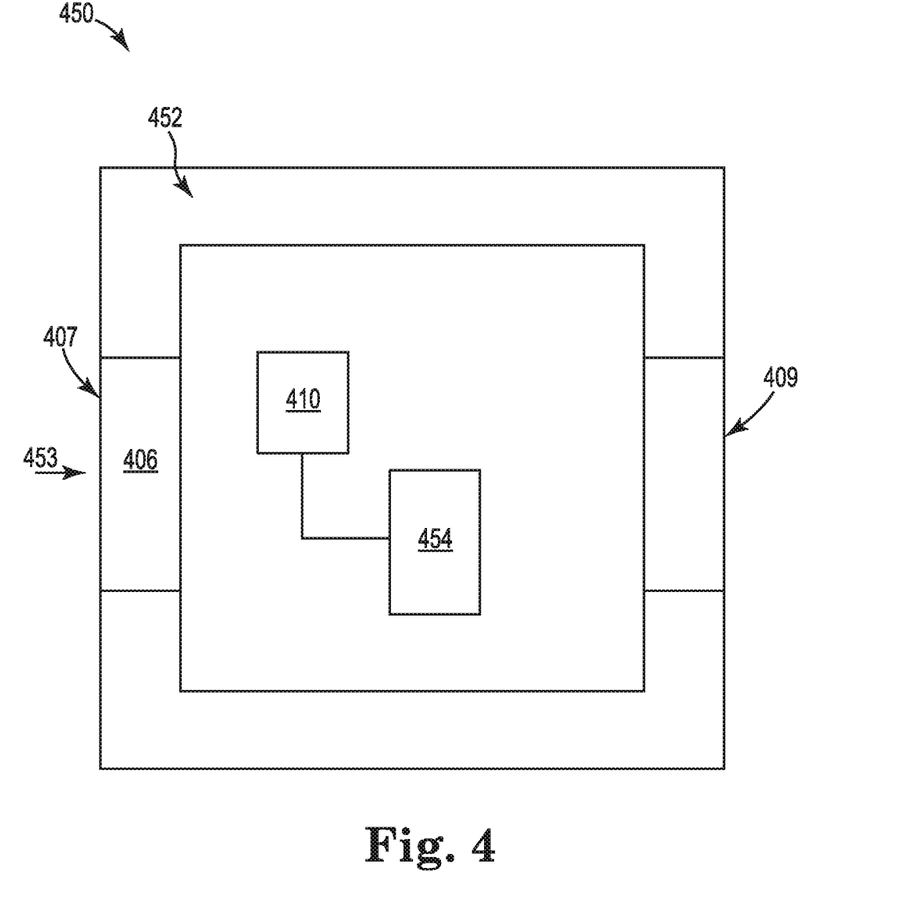
FIG. 4 illustrates an example of an electronic device including a TCPS in accordance with the disclosure.

Rather, in some examples, such as those described herein with respect to FIG. 4, an air filter or a TCPS can be positioned adjacent to but apart from each other in a non-integral manner. In such examples, the air filter 106 or the TCPS 110 can be removed independent of the other of the air filter 106 or the TCPS 110 to enable removal and replacement of one of but not both the air filter 106 and the thermal radiation sensor 110.

The air filter 106 has filtering structures. The filtering structures can be in the form of a mesh with small openings between the filtering structures to allow fluid to pass through but which can trap particulates of greater than a specified size, or particulates small enough to be attracted to, and accumulate on the surface of the filtering structures. The filtering structures can be part of a layer of a filtering medium, or multiple layers of filtering media. Although reference is made to the air filter 106 in the individual sense, it is noted that in further examples, the system 100 can include multiple air filters.

The TCPS 110 refers to a sensor that can measure a temperature of a thermally conductive material forming the TCPS 110. For instance, the TCPS 110 can be formed of a thermally conductive material selected from aluminum, copper, tin, tungsten, nickel, tungsten nitride, or combinations thereof, among other types of thermally conductive materials having a positive temperature coefficient of resistance. In some examples, the TCPS 110 can be formed of thermally conductive material selected that is non-electrically conductive such as various plastics (e.g., polyvinyl chloride) and/or various non-electrically conductive resins such as epoxy resins, among other types of thermally conductive materials that are non-electrically conductive.

In some examples, the TCPS 110 can be a polymeric material and a filler material that adds thermal conductivity without adding electrical conductivity. The polymeric material can be silicone rubber, silicone gels, polyethylene, polypropylene, an elastomer, natural or synthetic rubber, and/or epoxy. Examples of the filler material include aluminum nitride, boron nitride, silicon nitride, aluminum oxide, and beryllium oxide, but compounds or materials exhibiting similar chemical or physical properties may also be suitable. The filler is can be provided in the range of from 30% to 60% by volume and, in some examples, in the range of 40% to 50% by volume.

Figure 2:
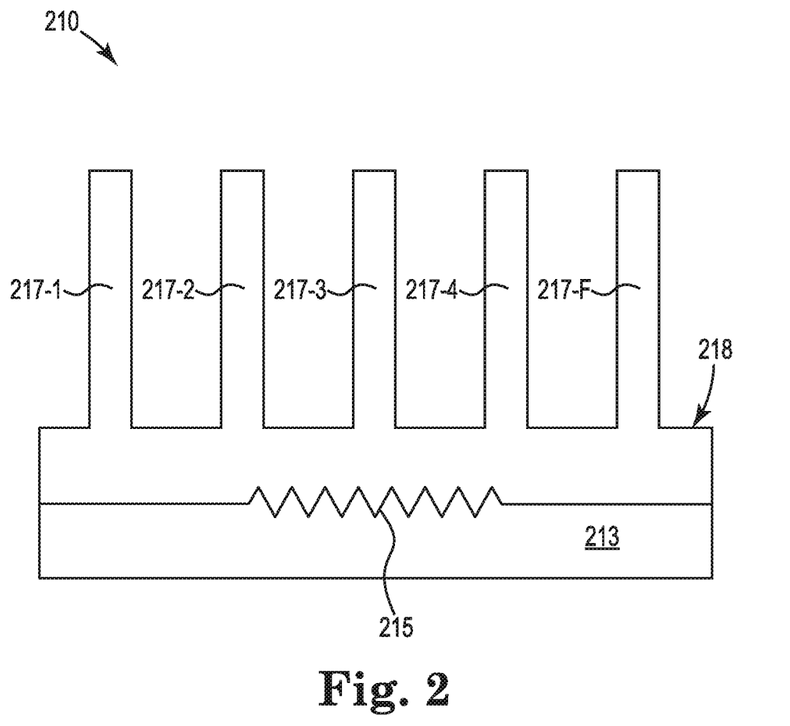
FIG. 2 illustrates a diagram of an example of a TCPS in accordance with the disclosure.

FIG. 2 illustrates a diagram of an example of a TCPS 210 in accordance with the disclosure. As illustrated in FIG. 2, the TCPS 210 can include a body 213 formed of a thermally conductive material, a temperature sensor 215, and projections 217-1, 217-2, 217-3, 217-4, . . . , 217-F. The TCPS 210 can be analogous or similar to the TCPS 110, the TCPS 310, and/or the TCPS 410. While the TCPS 210 is illustrated as a particular shape, having fins as the projections 217-1, . . . , 217-F on a given (upper) face of the body 213, and including a total of five projections, it is understood that other shapes, orientations of the projections, different type/shape of projection, and/or more or less projections are possible.

The temperature sensor 215 can be a thermistor, a thermocouple, a resistance thermometer, and/or a silicon bandgap temperature sensor, among other types of temperature sensors. The temperature sensor 215 can be located internally within and/or in direct contact with an exterior surface of the body 213 of the TCPS 210. For instance, as illustrated in FIG. 2, the temperature sensor 215 can be included internally within (i.e., encompassed at least partially within) the body 213 of the TCPS 210. Similarly, the temperature sensor 215 can be included internally within a projection of the projections 217-1, . . . , 217-F, in some examples. However, in some examples, the temperature sensor 215 can be an infrared temperature sensor or other type of temperature sensor to indirectly measure a temperature of an exterior surface of the body 213 of the TCPS.

While FIG. 2 illustrates the temperature sensor 215 as including a wire to measure a temperature the disclosure is not so limited. The temperature sensor 215 can include various components and be of a variety of possible shapes/appearance. Moreover, it is noted that in some examples, the temperature sensor 215 can be in direct contact with an exterior surface of the body 213 and/or on an exterior surface of the projections 217-1, . . . , 217-F. For instance, the temperature sensor can be coupled to an exterior surface of the TCPS 210 prior to inclusion of the TCPS in an electronic device and/or prior to substantially any particulate accumulation (visible to a normal 20/20 unaided human eye) on the exterior surface. In any case, the temperature sensor 215 can directly contact the body 213 of the TCPS 210.

In various examples, the projections 217-1, . . . , 217-F and/or the body 213 can be formed of a thermally conductive metal selected from aluminum, copper, tin, tungsten, nickel, tungsten nitride, combinations thereof, and/or other thermally conductive materials such as those having positive coefficient of resistance, among other possibilities. The projections 217-1, . . . , 217-F, refer to members that protrude from the body 213 of the TCPS 210 and have an exterior surface 218 on which particulates can accumulate. The projections can be formed of a same material or different material than the body 213. For instance, in various examples, each of the projections 217-1, . . . , 217-F is formed of the same material as the body 213. However, in some examples, each (or some but not all) of the projections 217-1, . . . , 217-F can be formed of a different material than a material of the body 213. Each of the projections 217-1, . . . , 217-F can be formed of the same material, among other possibilities.

Figure 3:
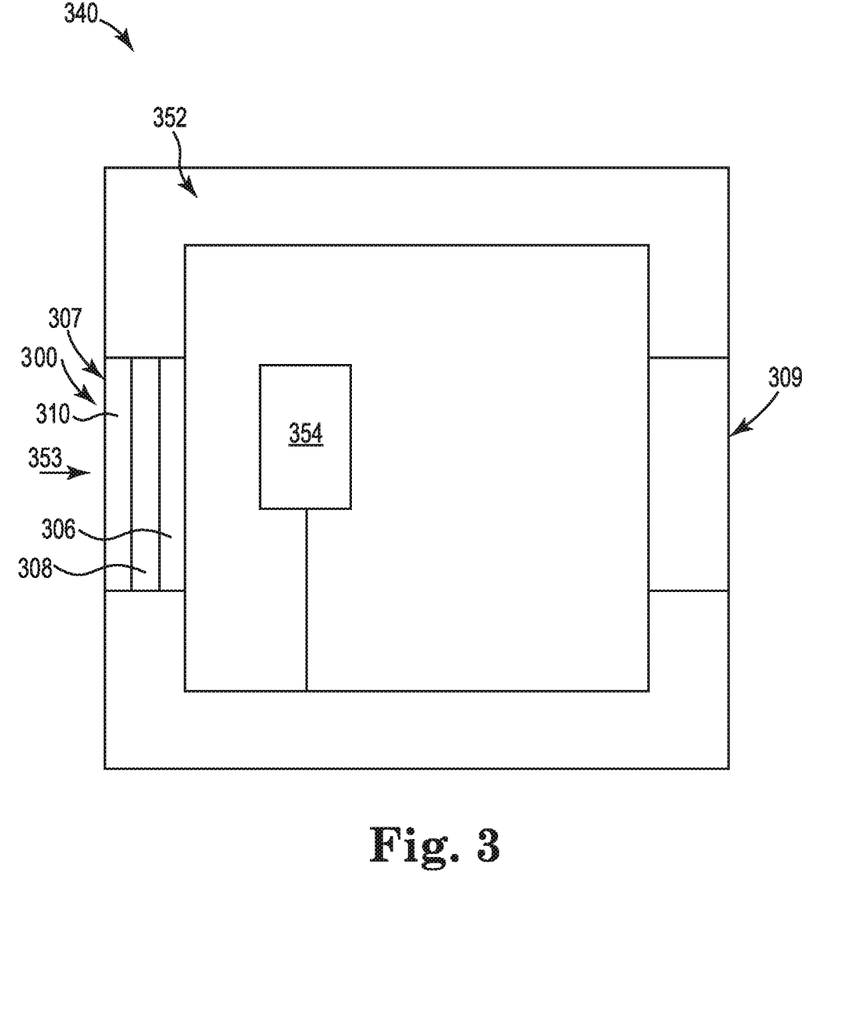
FIG. 3 illustrates an example of an electronic device including a TCPS in accordance with the disclosure.

FIG. 3 illustrates an example of an electronic device 340 including a TCPS 310 in accordance with the disclosure. As illustrated in FIG. 3, the electronic device 340 includes a housing 352 forming at least a portion of an exterior surface of the electronic device 340. The housing 352 can be comprised of metal, plastic, and/or various composite materials, among other suitable materials.

The housing 352 can house various components. For instance, each of the air filter 306, the TCPS 310, and a controller 354 can be housed in the housing 352 although other configurations are possible. Notably, the housing 352 can house various heat producing components. For instance, the controller, a graphics card (not shown), etc. can produce heat. The heat generated can lead to a temperature within the housing 352 that is greater than an ambient temperature surrounding the electronic device. A portion of such heat may heat the TCPS 310 in various examples.

The air filter 306 can be analogous or similar to air filter 106 and/or air filter 406 as described with respect to FIGS. 1 and 4, respectively. As illustrated in FIG. 3, the air filter 306 and the TCPS 310 can be integral parts of a common air filter system 300. In such examples, air filter 306 and the TCPS 310 can be in contact or can be space apart by an air gap 308 as illustrated in FIG. 3, among other possibilities. While FIG. 3 illustrates the air filter 306 and the TCPS 310 as being integral, it is understood the in various examples the air filter 306 and the TCPS 310 can be separate and distinct, for instance, as described herein with respect to FIG. 4. The air filter 306 can be positioned to remove particulates from air 353 or other fluid flowing through the air filter 306. For example, the air filter 306 can be positioned at an air inlet 307, as illustrated in FIG. 3, and/or can be positioned at an air outlet 309 of the electronic device 340. The TCPS 310 is positioned along a flow of the air 353 or other fluid to absorb or otherwise receive heat from the air 353 or other fluid.

The relative positions of the TCPS 310 and the air filter 306 can be varied. For instance, in some examples and as illustrated in FIG. 3, the TCPS 310 can be positioned on an inlet side of the air filter 306 along the path of the air 353 flowing through the air filter. That is, in such examples, the TCPS 310 is positioned physically closer to the inlet 307. Stated differently, the air filter 306 can be positioned physically closer to the outlet 309 than the TCPS 310, in some examples.

However, in some examples and as illustrated in FIG. 4, the TCPS can be positioned on an outlet side of the air filter along the path of the air flowing through the air filter such that the TCPS is closer to an outlet than the air filter. In such examples, the TCPS may experience a reduce volumetric flow of air due to particulate accumulation along a path of air flowing through the air filter and/or the electronic device. As a result, the TCPS may experience an increase of temperature as compared to a 'clean' air filter and/or 'clean' electronic device without substantial particulate accumulations. Consequently, an increase in temperature of TCPS at a second time as compared to a first time at the same or similar operational/environmental conditions, as described herein, can provide an indication or be used to predict that the air filter is to be cleaned or replaced. In any case, the air 353 can flow around an exterior surface of the TCPS 310 and deposit some of the particulates contained on in the air 353 on the exterior surface of the TCPS.

As particulates are deposited on the exterior surface of the TCPS 310 a temperature, as measured by the temperature sensor of the TCPS can change. For instance, as particulates and/or a thickness of a particulate layer on an exterior surface of the TCPS 310 increases, a difference between an actual rate of temperature change of the TCPS from a target rate of temperature change of the temperature sensor may also increase.

As used herein, a "target rate" of temperature change refers a predetermined rate of temperature change of the TCPS under known environmental conditions (e.g., a known humidity, amount of heat applied to a TCPS, etc.) and known operational conditions and with substantially no particulate accumulation on an exterior of the TCPS 310. For instance, the target rate can correspond to a rate measured of a new and/or 'clean' temperature sensor provided from a manufacture that has not been employed in an electric device and is operated at known operational conditions of the electronic device. Operational conditions of the electronic device refer to conditions such as a processor sleep state, a fan speed, a memory and/or processing unit power consumption, etc. of the electronic device that may change due to an operation state of the electronic device.

As used herein, an "actual" rate of temperature change refers to a measured rate of temperature change experienced by a TCPS positioned in a path of the air flowing through an air filter of an electronic device at known operational and environmental conditions. For instance, the actual rate of temperature change can be a difference between a first temperature measurement and a second temperature measurement taken subsequent to the first temperature measurement while accounting for any change in operational and/or environmental conditions between the times of the first and second measurements. That is, the actual rate of temperature change can be indicative of an amount of accumulation of particulates on an exterior surface of the TCPS rather than changes in operational and/or environmental conditions. For instance, in various examples, a temperature sensor included in the TCPS can measure a first temperature of the TCPS at a first time and can measure a second temperature of the TCPS at a second time, where the second temperature is greater than the first temperature during operation of the electronic device 340 as the TCPS 310 is being heated, as described herein. In some examples, the first and second measurements can be taken at substantially the same operational conditions (e.g., during runtime operation of the electronic device) while accounting for any changes in environmental conditions between the first and second measurements, among other possibilities. As such, any temperature changes can be attributed to an amount of particulate accumulation (e.g., on the TCPS) rather than changes in operational conditions of the electronic device and/or changes in environmental conditions.

The TCPS 310 and/or a temperature sensor included in the TCPS 310 can provide the measured first and second temperatures and the first and second times to the controller 354. The controller 354 refers to a hardware logic device (e.g., a logic die, application-specific integrated circuit (ASIC) microcontroller, field programmable gate array (FPGA), or other such logic device that can execute instructions to perform various operations related to an air filter system with a TCPS. The controller 354 can include hardware components such as a hardware processor and/or computer-readable and executable non-transitory instructions to perform various operations related to an air filter system with a thermal radiation sensor.

For example, the controller 354 can include and/or receive instructions to determine an actual rate of temperature change based on the measured first temperature and the measured second temperature; compare the actual rate of temperature change to a target rate of temperature change; and provide a notification when a difference between the actual rate of temperature change and the target rate of temperature change is greater than an accumulation threshold indicative of a threshold amount of particulate accumulation on the TCPS (e.g., (e.g., 1, 2, 5, 10, 20, 50, millimeters of particulate accumulation on an exterior surface of the TCPS). The computer-readable and executable non-transitory instructions (e.g., software, firmware, programming, etc.) may be stored in a memory resource (e.g., computer-readable medium) or as a hard-wired program (e.g., logic) included in and/or coupled to the controller 354.

The hardware processor (not shown), as used herein, can include a hardware processor capable of executing instructions stored by a memory resource. A hardware processor can be integrated in an individual device or distributed across multiple devices. The instructions (e.g., computer-readable instructions (CRI)) can include instructions stored on the memory resource and executable by the hardware processor to implement a desired function (e.g., instructions executable by the hardware processor to compare a measured electrical resistance to a threshold resistance, etc.).

A memory resource, as used herein, includes a memory component capable of storing non-transitory instructions that can be executed by a hardware processor. A memory resource can be integrated in an individual device or distributed across multiple devices. Further, memory resource can be fully or partially integrated in the same device as a hardware processor or it can be separate but accessible to that device and the hardware processor.

The memory resource can be in communication with a hardware processor via a communication link (e.g., path). The communication link can be local or remote to an electronic device associated with a hardware processor. Examples of a local communication link can include an electronic bus internal to an electronic device where the memory resource is one of volatile, non-volatile, fixed, and/or removable storage medium in communication with a hardware processor via the electronic bus.

FIG. 4 illustrates an example of an electronic device 450 including an air filter 406 and a TCPS 410 in accordance with the disclosure. As illustrated in FIG. 4, the electronic device 450 can include a housing 452, the air filter 406, the TCPS 410, and a controller 454.

While FIG. 4 illustrates the air filter 406 and the thermal radiation sensor 410 as being distinct, it is understood that in various examples the air filter 406 and the thermal radiation sensor 410 can be integral or otherwise coupled together to promote removal of an air filter system including both the air filter 406 and the thermal radiation sensor 410. As mentioned, the air filter 406 is positioned to remove particulates from air 453 or other fluid flowing through the air filter 406. For example, the air filter 406 can be positioned on an air inlet 407 and/or can be positioned at an air outlet 409 of the electronic device 450. The TCPS 410 can be positioned along a flow of the air 453 or other fluid to absorb or otherwise receive heat from the air 453 or other fluid.

As mentioned, a relative location of the TCPS 410 can vary from a position illustrated in FIG. 3 and/or a position illustrated in FIG. 4. For instance, in some examples, the TCPS 410 can be adjacent to and/or in contact with a heat producing component such as a graphics card (not shown).

In some examples, the controller 454 can predict when a difference between an actual rate of temperature change and the target rate of temperature change will be greater than the accumulation threshold. For instance, in some examples, a value of a difference between an actual rate of temperature change and a target rate of temperature change can be compared to the accumulation threshold. Based on such comparison and/or a plurality of such comparisons over a period of time it can be predicted when a value of an actual rate of temperature change and a target rate of temperature change. Moreover, such prediction can desirably predict when the filter should be replaced or cleaned to function as intended.

A prediction notification (indicating to a user to replace or clean the filter) can be provided based on the prediction. The prediction notification can indicate to a user to replace or clean the filter at a time of providing the prediction indication and/or within an upcoming time window (e.g., days, weeks, etc.) during which the filter should be cleaned or replaced. For example, a prediction notification can indicate a predicted date when a filter may by indicated for replacement or cleaning based on prediction of when the accumulation threshold will be satisfied (i.e., when a difference between the actual rate of temperature change and the target rate of temperature change is greater than an accumulation threshold).

Figure 5:
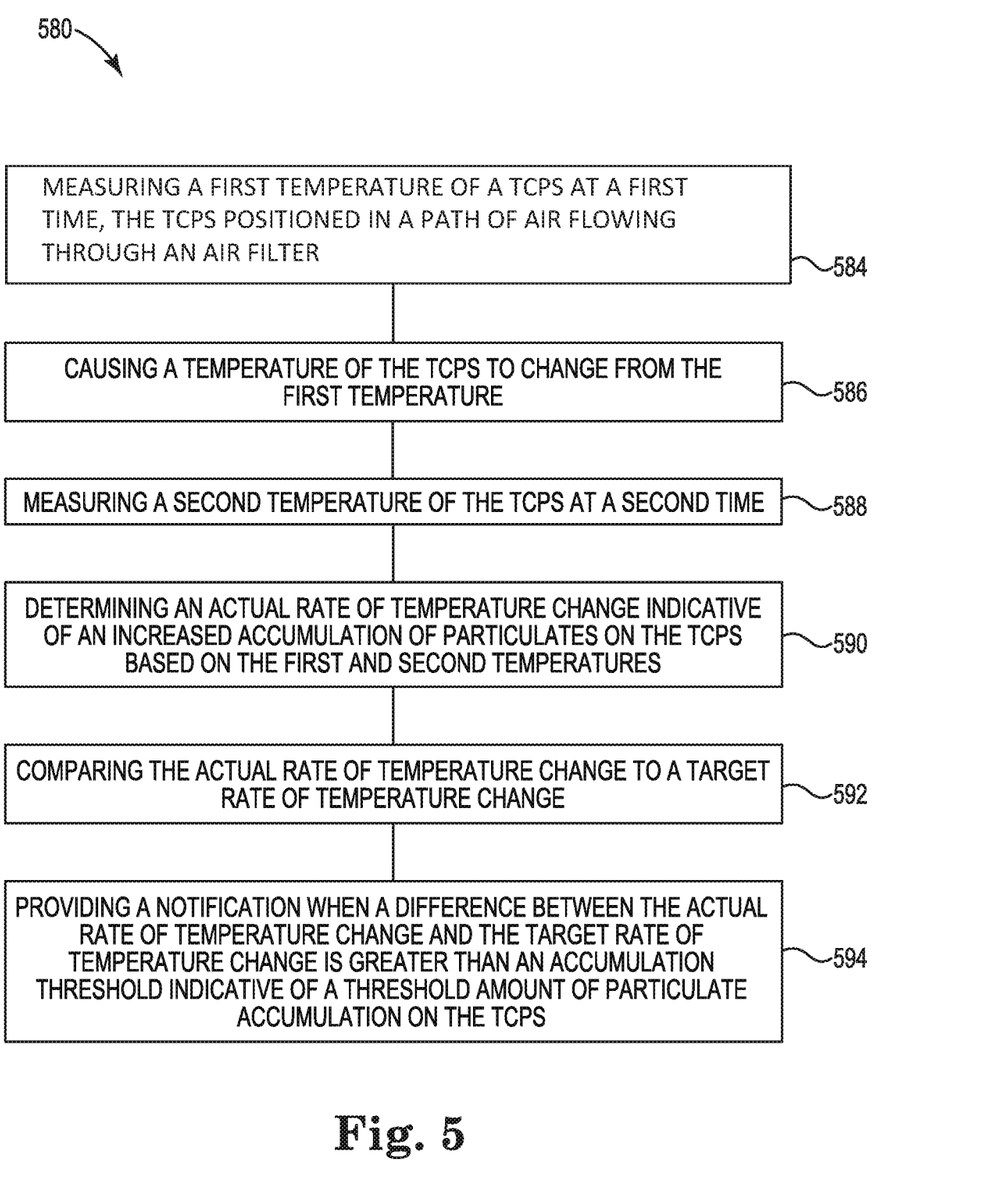
FIG. 5 illustrates a flow diagram of an example of a method suitable with a TCPS in accordance with the disclosure.

FIG. 5 illustrates a flow diagram of an example of a method suitable with a TCPS in accordance with the disclosure. As illustrated at 584, the method 580 can include measuring a first temperature of a TCPS at a first time, the TCPS positioned in a path of air flowing through an air filter. Temperature measurements (e.g., the first temperature and/or a second temperature) can be taken periodically, continuously, and/or in response to an input such as a request from a user or another component.

As illustrated at 586, the method 580 can include causing the temperature of the TCPS to change from the first temperature. For example, operation of an electronic device including the TCPS can cause the temperature of the TCPS to change, among other possibilities such as changes in environmental conditions when may cause the temperature of the TCPS to change. The temperate change can be an increase in temperature or a decrease in temperature. For instance, the temperature change can be an increase attributable at least in part to operation of an electronic device including the TCPS.

As illustrated at 588, the method can include measuring a second temperature of the TCPS at a second time. That is, the second temperature at the second time can be different than the first temperature at the first time due at least in part to causing the temperature of the TCPS to change at 586.

As illustrated at 590, the method can include determining an actual rate of temperature change indicative of an increased accumulation of particulates on the TCPS based on the first and second temperatures. For instance, an actual rate of temperature increase can be equal to a difference in temperatures divided by a difference in time. For example, the temperature sensor can measure a first temperature (e.g., 30° C.) at a first time and measure a second temperature (e.g., 35° C.) and a second time taken one minute after the first time. In such an example, the actual rate of temperature increase is equal to 5° C. increase per minute. As mentioned, a temperature change can be attributed at least in part to operation of an electronic device including the TCPS. For instance, in some examples, it may be assumed or known that a temperature within the electronic device and/or a temperature of a heat producing component is increasing or decreasing over an entirety of an elapsed time from a first time and temperature measurement to a second time and temperature measurement, among other possibilities. For instance, in the example above, the TCPS is subject to an increasing temperature over an entirety of an elapsed time from the first time to the second time.

As illustrated at 592, the method 580 can include comparing the actual rate of temperature change to a target rate of temperature change. Such a comparison can include determination of a value of a difference between the actual rate of temperature change (e.g., 5° C. increase per minute) and the target rate of temperature change (e.g., 15° C. increase per minute). The difference can indicate an amount of particulate accumulation on the TCPS as accumulated particles may have insulative qualities which can reduce a rate of heat transfer between air flowing over the TCPS and the TCPS. Such temperature measurements and/or the comparison of temperature measurements can occur in intervals, upon input from a user, or continuously, among other possibilities.

As illustrated at 594, the method 580 can include providing a notification when a difference (e.g., 10° C.) between the actual rate of temperature change (e.g., 5° C.) and the target rate of temperature change (e.g., 15° C.) is greater than an accumulation threshold (e.g., 7° C.) indicative of a threshold amount of particulate accumulation on the TCPS. The accumulation threshold can correspond to a thickness (e.g., 10 millimeters) of particulates on an exterior surface of the TCPS and a known or estimated insulative capability of the thickness of the particulates. The accumulation threshold can be predetermined and/or configurable. The notification can be a notification to clean the air filter and/or to replace an air filter system including the air filter. The notification can be provided via a display of an electronic device (e.g., laptop) housing the thermal radiation sensor. In this manner, a user of the electronic device can be notified, among other possibilities. As mentioned, in some examples, the notification can be a predication notification that indicates to a user to replace or clean the filter at a time of providing the prediction notification and/or within an upcoming a given window (e.g., days, weeks, etc.) following the predication notification during which the filter should be cleaned or replaced. In some examples, the target rate of temperature change can be equal to a threshold rate of temperature change. For instance, the threshold rate of temperature change can be equal to zero, among other possibilities.

In some examples, the method 580 can include measuring environmental conditions. That is, a temperature such as those described herein can be a function of particulate accumulation but also a function of an ambient temperature, an ambient barometric pressure, an ambient relative humidity and/or condensation, and/or a volumetric flow of air flowing through an air filter, among other environmental conditions. Therefore, in some examples, an electronic device can include an ambient temperature sensor (not shown), an ambient bar pressure sensor, an ambient relative humidity sensor, and/or a flow meter to measure an amount of air flow can be added to the electronic device to allow for particulate accumulation to be more accurately inferred from the temperature measurements described herein.

For instance, in some examples the method 580 can include adjusting an actual rate of temperature change and/or a target rate of temperature change from environmental conditions. For instance, a controller can include (e.g., instructions based on adjustment values in a table having various given environmental conditions and corresponding adjustment values) or receive instructions to adjust temperature change and/or a target rate of temperature change from environmental conditions to account for change in environmental conditions. For example, changes in environmental conditions from a those at a first time of a first temperature measurement to those at a second time of a second temperature measurement can be accounted for by adjustment of the first temperature and/or the second temperature, among other possibilities.

The figures herein follow a numbering convention in which the first digit corresponds to the drawing figure number and the remaining digits identify an element or component in the drawing. For example, reference numeral 106 can refer to element "06" in FIG. 1 and an analogous and/or identical element can be identified by reference numeral 406 in FIG. 4. Elements shown in the various figures herein can be added, exchanged, and/or eliminated to provide additional examples of the disclosure. In addition, the proportion and the relative scale of the elements provided in the figures are intended to illustrate the examples of the disclosure, and should not be taken in a limiting sense.

It is understood that when an element is referred to as being "on," "connected to", "coupled to", or "coupled with" another element, it can be directly on, connected to, or coupled with the other element or intervening elements can be present. "Directly" coupled or in "direct contact" refers to being connected without intervening elements. "Removably" coupled refers to a component being able to be decoupled in a predesignated manner from another component. As used herein, "logic" is an alternative or additional processing resource to execute the actions and/or functions, etc., described herein, which includes hardware (e.g., various forms of transistor logic, ASICs, etc.), as opposed to computer executable instructions (e.g., software, firmware, etc.) stored in memory and executable by a processing resource.

What is claimed:

1. An air filter system, comprising:
   an air filter to remove particulates from air flowing through the air filter; and
   a thermally conductive particulate sensor (TCPS) including a body formed of a thermally conductive material, a temperature sensor, and a plurality of projections extending from the body, the TCPS positioned adjacent to but apart from an inlet side of the air filter in a path of the air flowing through the air filter to:
   measure a first temperature of the TCPS at a first time;
   measure a second temperature of the TCPS at a second time; and
   provide the measured first temperature and the measured second temperature to a controller that is to:
   determine an actual rate of temperature change based on the measured first temperature and the measured second temperature;
   compare the actual rate of temperature change to a target rate of temperature change; and
   provide a notification when a difference between the actual rate of temperature change and the target rate of temperature change is greater than an accumulation threshold indicative of a threshold amount of particulate accumulation on the TCPS.

2. The system of claim 1, wherein the temperature sensor is selected from a group consisting of a thermistor, a thermocouple, a resistance thermometer, and a silicon bandgap temperature sensor.

3. The system of claim 1, wherein the TCPS is formed of a thermally conductive material selected from a metal, a plastic, a resin, or combinations thereof.

4. The system of claim 1, wherein the temperature sensor is located internally within or in direct contact with an exterior surface of a body of the TCPS.

5. An electronic device comprising:
   a housing; and
   an air filter system coupled to the housing, the air filter system including:
   an air filter to remove particulates from air flowing through the air filter; and
   a TCPS including a body formed of a thermally conductive material, a temperature sensor, and a plurality of projections extending from the body, the TCPS positioned adjacent to but apart from an inlet side of the air filter in a path of the air to provide a first temperature measured at a first time and a second temperature measured at a second time to a controller that is to:
   determine an actual rate of temperature change indicative of an accumulation of particulates from the air on the TCPS based on the measured first temperature at the first time and the measured second temperature at the second time; and
   provides a notification when a difference between the actual rate of temperature change and a target rate of temperature change is equal to or greater than an accumulation threshold indicative of a threshold amount of particulate accumulation on the TCPS.

6. The electronic device of claim 5, wherein the controller predicts when a difference between an actual rate of temperature change and the target rate of temperature change will be greater than the accumulation threshold.

7. The system of claim 1, wherein the plurality of projections are fins extending from a face of the body.

8. The system of claim 7, wherein the face is an upper face of the body.

9. The system of claim 7, wherein the temperature sensor is included in the body or a fin of the plurality of fins.

10. The system of claim 1, wherein the air filter is included in a plurality of air filters, and wherein the TCPS is spaced apart from each air filter of the plurality of air filters.

11. A method comprising:

measuring a first temperature of a TCPS at a first time, the TCPS including a body formed of a thermally conductive material, a temperature sensor, and a plurality of projections extending from the body, the TCPS positioned adjacent to but apart from an inlet side of the air filter in a path of air flowing through an air filter;

causing a temperature of the TCPS to change from the first temperature;

measuring a second temperature of the TCPS at a second time;

determining an actual rate of temperature change indicative of an increased accumulation of particulates on the TCPS based on the first and second temperatures;

comparing the actual rate of temperature change to a target rate of temperature change; and providing a notification when a difference between the actual rate of temperature change and the target rate of temperature change is greater than an accumulation threshold indicative of a threshold amount of particulate accumulation on the TCPS.

12. The method of claim 11, further comprising collecting environmental conditions selected from a group consisting of an ambient air temperature, an ambient relative humidity, an ambient barometric pressure, and a volumetric flow of the air flowing through the air filter.

13. The method of claim 12, wherein the actual rate of temperature change is adjusted for environmental conditions.

14. The method of claim 13, wherein the target rate of temperature change is adjusted for environmental conditions.

15. The method of claim 11, wherein the target rate of temperature change is equal to a threshold rate of temperature change.

* * * * *